United States Patent
Chen et al.

(10) Patent No.: US 6,700,165 B1
(45) Date of Patent: Mar. 2, 2004

(54) SEMICONDUCTOR STRUCTURE WITH THE COMMON SOURCE LINE

(75) Inventors: Po-An Chen, Hsinchu (TW); James Juen Hsu, Saratoga, CA (US)

(73) Assignee: Winbond Electronics Corporation, Hsinchu (TW)

(*) Notice: Subject to any disclaimer, the term of this patent is extended or adjusted under 35 U.S.C. 154(b) by 0 days.

(21) Appl. No.: 10/279,795

(22) Filed: Oct. 25, 2002

(51) Int. Cl.$^7$ ................................................. H01L 29/76
(52) U.S. Cl. .................... 257/390; 257/392; 257/393; 257/391
(58) Field of Search ................... 257/295, 296, 257/298, 300, 314, 315, 316, 382, 384, 390, 392, 393; 438/128, 129, 130, 201, 211, 238, 239, 240, 257, 275, 278, 290

(56) References Cited

U.S. PATENT DOCUMENTS

| | | | |
|---|---|---|---|
| 5,072,275 A | * 12/1991 | Vora | 257/369 |
| 5,362,662 A | * 11/1994 | Ando et al. | 438/278 |
| 5,519,239 A | * 5/1996 | Chu | 257/314 |
| 6,157,575 A | * 12/2000 | Choi | 365/185 |
| 6,441,421 B1 | * 8/2002 | Clevenger et al. | 257/296 |
| 6,515,329 B2 | * 2/2003 | Lee et al. | 257/315 |
| 2002/0017692 A1 | * 2/2002 | Shimizu et al. | 257/390 |

* cited by examiner

Primary Examiner—Steven Loke
Assistant Examiner—Quang Vu
(74) Attorney, Agent, or Firm—Rosenberg, Klein & Lee

(57) ABSTRACT

A semiconductor structure with common source line, the semiconductor structure has two word lines, some bit lines, a silicon-based layer and a suicide layer. The silicon-based layer is located between and electrically separated from these word lines, but is electrically coupled with these bit lines. The silicide layer is located over and electrically coupled with the silicon-based layer. Moreover, suicide layer and silicide layer could be replaced by a silicon-base conductor layer, and are directly electrically coupled with some separated doped regions that located inside a substrate.

9 Claims, 3 Drawing Sheets

| Cost | metal>silicide>doped poly>doped region |
|---|---|
| Sheet resistence | doped region>doped poly>silicide>metal |

SEMICONDUCTOR STRUCTURE WITH THE COMMON SOURCE LINE

BACKGROUND OF THE INVENTION

1. Field of the Invention

The invention relates to a semiconductor structure with the common source line, and is especially related to a common source line which has low sheet resistance, low cost, low side effect, and simple fabrication.

2. Description of the Prior Art

The common source line is a popular structure inside the semiconductor product, especially is broadly used by the memory cell, such as the flash memory. As shown in the brief top-view illustration FIG. 1A, common source line 10 usually is located between two gates 11, which are neighboring but separated, common source line 10 is electrically separated from these gates 11 but is coupled with some doped regions 12 inside substrate 13. For example, for some flash memory cell, two gates 11 are two word lines, some doped regions 12 are some bit lines, and common source lines 10 is used to control the state of some source (each source is a part of a bit line). Thus, usually several bit lines share a common source line which usually contacts with a source contact.

The function of common source line 10 is electrically coupled with some doped regions 12 which usually are located in and adjacent to the surface of substrate 13. Thus, as shown in FIG. 1B and FIG. 1C, both are the brief cross-section illustrations along AA' of FIG. 1A, common source line 10 has two conventional structures. One conventional structure is shown in FIG. 1B, partial substrate 13 between neighboring doped regions 12 are transformed into conductive regions 14; another conventional structure is shown is FIG. 1C, metal layer 15 is formed on isolation layer 16 and directly electrically coupled with doped regions 12. Moreover, the material of metal layer 15 usually is tungsten which has smaller resistance, and both the material and the fabrication of conductive regions are changeable. For example, conductive regions 14 could be formed by directly implanting ions into substrate 13; conductive regions 14 also could be formed by firstly removing isolation layer 16 between neighboring doped regions 12 and then filling low resistance material to form required conductive regions 14.

Clearly, the application of conductive regions 14 at least has following defects: fabrication with removal of isolation layer 16 is too complicated, and fabrication with directly implantation inevitably affects the quality of the bit lines which usually also are doped regions. Further, the application of metal layer 15 at least has following defects: sometimes it is hard to form common source line 10 with high conductivity, and sometimes cost of common source line 10 with high conductivity is high, where the cost includes the material cost and the fabricating cost.

Accordingly, although the conventional technology has two available common source line structures, because none could simultaneously satisfy the requirements of low cost, low side effect and simple fabrication, it is desired to develop a new common source line structure.

SUMMARY OF THE INVENTION

One main object of this invention is providing a common source line with following advantages: low resistance, low cost, low side effect and simple fabrication.

Another main object of this invnetion is providing semiconductor structure which achieves high bit lines to source contact ratio by properly modifying the used common source line.

Yet one object of this invention is forming a conductive structure which connects some doped regions by applying the characteristics of the common source line which present by this invention.

The invention synthesizes the advantages of two conventional common source line structures. On one hand, this invention lets the common source line be located on the substrate to simply the corresponding fabrication and to reduce the side effect. On the other hand, this invention forms the common source line by using the silicon material that is cheaper than the metal such as tungsten. Further, it should be emphasized that the application of the silicon material let the invention could be incorporated with the self-alignment metal silicide fabricating process. Thus, the whole fabrication of the integrated circuits could be further simplified. And the metal silicide on the silicon material could be used to conduct the current for its resistance being lower than that of the silicon-based layer, and then the net resistance of the common source line which is made of both silicon and metal silicide could be further reduced.

BRIEF DESCRIPTION OF THE DRAWINGS

A more complete appreciation and many of the attendant advantages will be readily obtained as the same becomes better understood by reference to the following detailed description when considered in connection with the accompanying drawings.

DESCRIPTION OF THE PREFERRED EMBODIMENT

Initially, by comparing two conventional common source line structures, advantages and defects of them are clear. One structure, which has metal on the substrate, has simple fabrication and structure, but cost could be higher. Another structure, which has conductive regions inside the substrate, has complicated fabrication and structure, but cost could be lower.

Clearly, the latter structure inevitably meets the difficulty of complicated fabrication, no matter what doped regions are used. In contrast, the former structure could be improved to simultaneously have simple fabrication and low cost while the metal material being replaced by some cheaper material. Without question, the resistance of the cheaper material is an important limitation for the function of the common source line is conducting current.

Figure 1A:
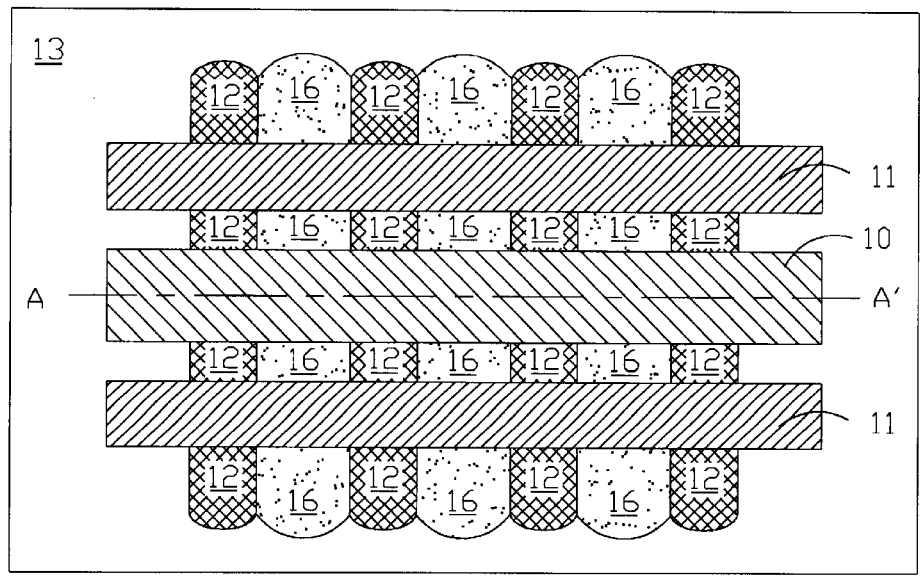
FIG. 1A is a brief top-view illustration of a semiconductor structure with the common source line.
Figure 1B:
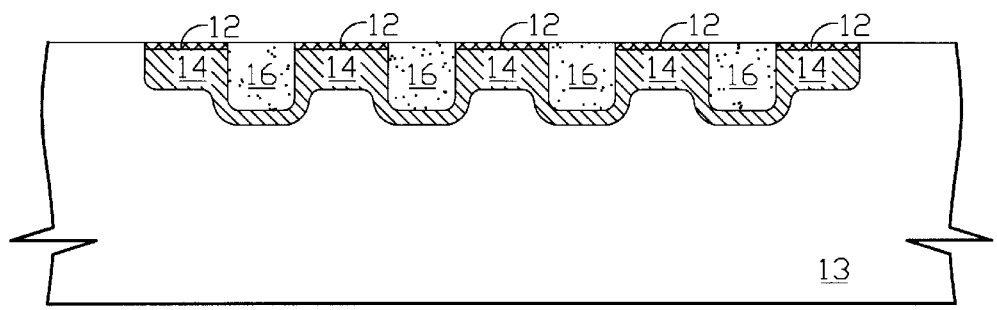
FIG. 1B and FIG. 1C are two the brief cross-section illustrations along AA' of FIG. 1A.
Figures 1C, 2:
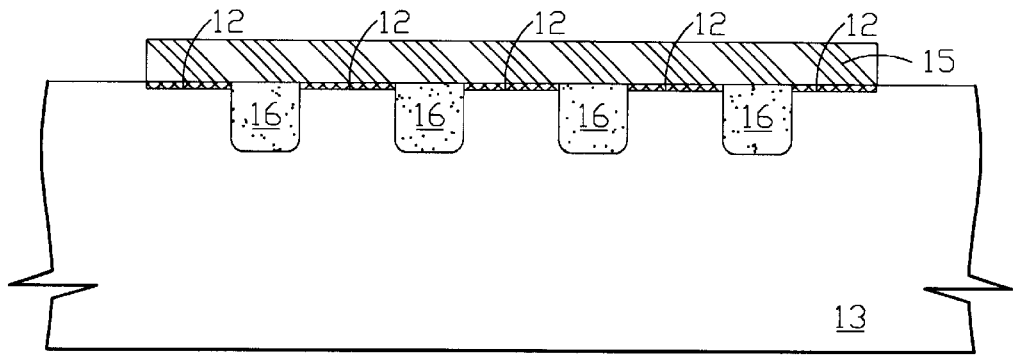
FIG. 2 is a table for comparing the resistance and the cost of some popular material of conventional semiconductor fabrication.

Sequentially, the present invention briefly compare the resistance and cost, includes material cost and fabricating cost, of some popular material of conventional semiconductor fabrication. As shown in FIG. 2, the order of cost is metal, especially tungsten, metal silicide, doped polysilicon, and doped region in sequence. Further, the order of resistance is doped region, doped polysilicon, metal silicide, and metal, especially tungsten.

Clearly, because the doped region is formed by implanting ions into the substrate, it is impossible to form a common source line on the substrate by the usage of the doped regions. Besides, because the resistance of the metal silicide is briefly equivalent to the resistance of the metal, the quality of the common source line is not obviously degraded while the metal being replaced by the metal silicide. Further, the cost of the metal silicide is high and the silicon-based layer must be formed before the metal silicide is formed, except while the metal silicide layer being formed by deposition. Moreover, the doped polysilicon not only has a low resistance than both the metal and the metal silicide but also is suitable for forming the self-alignment metal silicide. Hence, it is reasonable that a low cost common source line which is located on the substrate could be formed by the usage of both the metal silicide and the doped polysilicon.

In short, one main characteristic of this invention is to form a low cost common source line on the substrate by the usage of both the metal silicide and the doped polysilicon. Furthermore, because the resistance of the metal silicide is lower than that of the doped polysilicon, the current usually only flows through the metal silicide. Thus, the current usually only flows through the doped polysilicon, which is located under the metal silicide, while the current being desired to flow into some doped regions (bit lines) under the doped polysilicon. In other words, the importance of the resistance of the doped polysilicon is less than that of the metal silicide, and then the doped polysilicon could be replaced by any silicon-based material that could conduct current and assist the formation of the metal silicide.

Figure 3A:
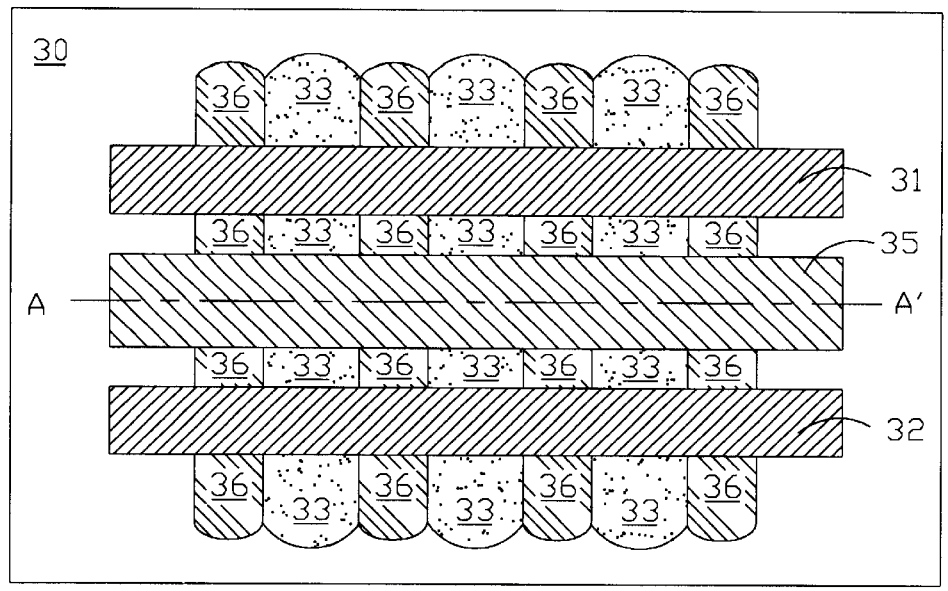
FIG. 3A and FIG. 3B are one top-view illustration of one preferred embodiment and one cross-section illustration along the common source line of the preferred embodiment.
Figure 3B:
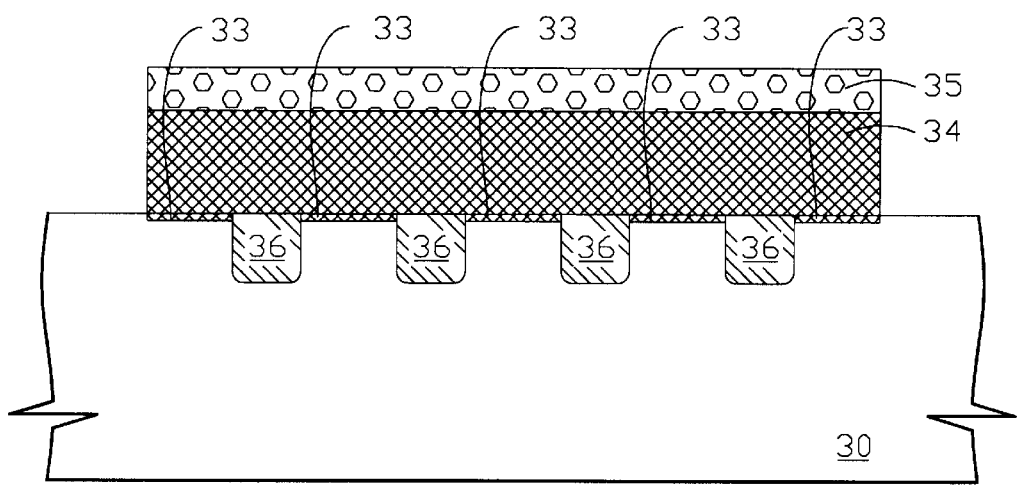

One preferred embodiment of this present invention is a semiconductor structure with the .common source line. As the brief top-view illustration FIG. 3A and the brief cross-sectional illustration, along AA' of FIG. 3A, FIG. 3B, the embodiment at least has first word line 31, second word line 32, some bit lines 33, silicon-based layer 34, metal silicide layer 35, and some isolations 36. To compare with FIG. 1A through FIG. 1C, indisputable, this present invention uses both silicon-based layer 34 and metal silicide layer 35, which is located over silicon-based layer 34, to form a common source line on substrate 30, but the layout of the corresponding semiconductor structure is not modified.

As shown in these Figs, silicon-based layer 34 is located on these isolations 36 and between first word line 31 and second word line 32, silicon-based layer 34 also is electrically coupled with these bit lines 33 but is electrically separated from these word lines 31/32. Further, Metal silicide layer 35 is located over silicon-based layer 34 and electrically coupled with silicon-based layer 34. Surely, because metal silicide layer 35 could be formed by the deposition, such as chemical vapor deposition, or by the self-alignment silicide fabricating process, the embodiment only limits the current between metal silicide layer 35 and silicon-based layer 34 over each bit lines 33. In other words, the embodiment does not exclude the existence of any material or any structure between metal silicide layer 35 and silicon-based layer 34, even these Figs. do not show these possible variations.

In general, each word line 31/32 is a gate, and usually has a spacer on its sidewall. Further, to reduce the resistance, silicon-based layer 34 usually is a polysilicon-based layer, and especially is a doped polysilicon-based layer, such as the N-type doped polysilicon-based layer. Besides, metal silicide layer 35 usually is a TiSix layer or a CoSix layer, where x is a positive integer.

Surely, for many semiconductor structures such as memory cells, some bit lines, especially some neighboring bit lines or the sources of some transistors of same word lines, are turned on or turned off at the same time. Thus, as usual, some bit lines are connected by one common source line which is electrically coupled with a source contact that electrically separated from these word lines 31/32. Hence, because both metal silicide layer 35 and silicon-based layer 34 are conductor, the source contact could be only electrically coupled with metal silicide layer 35 or be only electrically coupled with silicon-based layer 34. In other words, it is unnecessary to let the source contact electrically coupled with both silicon-based layer 34 and metal silicide layer 35.

Further, to ensure these word lines 31/32 is electrically separated from the common source line, the total thickness of silicon-based layer 34 and metal silicide layer 35 usually is larger than the height of each word line 31/32 on substrate 30, especially while metal silicide layer 35 being formed by the self-alignment fabricating process.

In short, because silicon-base layer could be formed by deposition and be easily to be doped, and because metal silicide layer 35 also could be formed self-alignment fabrication process, the whole fabrication of this embodiment is not complicated and would not induce any side effect on bit lines 33. Moreover, because this embodiment does not use any high cost material such as tungsten, the whole cost of this embodiment also is cheap. Besides, because this embodiment essentially uses metal silicide layer 35, whose resistance is closed to the metal, to conduct current, the whole resistance of this embodiment also is not high. Accordingly, this embodiment really provides a common source line that has low resistance, low cost, low side effect and simple fabrication.

Besides, because this embodiment not only uses the metal silicide but also does not cover the metal silicide by any material or any structure, the embodiment at least has following advantages. First, because the resistance of the metal silicide is closed to that of the metal, this embodiment could form a common source line having high bit lines to source contact number ratio, and then could reduce the scale of any semiconductor structure which has the common source line. Second, because the fabrication of the metal silicide could be incorporated with the formation of salicide of the logic circuits, this embodiments provides a possible solution to further simple the whole fabrication of the integrated circuits.

Furthermore, because the difference between last embodiment of the conventional technology essentially only is the structure of the common source line, and because the common source lines electrically couples some bit lines, or some sources of some transistors, another preferred embodiment of this invention is a variation of the lest embodiment: a conductive structure for connecting some doped regions.

The embodiment at least has silicon-based layer and metal silicide layer. The silicon-based layer is located on a substrate, the silicon-based layer also is electrically coupled with numerous doped regions which are located inside the substrate. The metal silicide layer is located over and electrically coupled with the silicon-based layer.

Further, the only limitations of the silicon-based layer are it must be able of conducting current and the resistance of it is not obviously larger than the resistance of the metal. In general, the silicon-based layer usually is a polysilicon-based layer, and especially is a doped polysilicon-based layer, such as the N-type doped polysilicon-based layer.

In contrast, the metal silicide layer usually is a TiSix layer or a CoSix layer, where x is an integer. For example, the metal silicide layer could be a CoSi2 layer or a TiSi2 layer.

Moreover, this embodiment only requires that the metal silicide layer is electrically coupled with the silicon layer, such as the metal silicide layer is directly contacted with the silicon-based layer over each doped region. The embodiment does not exclude the existence of any material or any structure between the metal silicide layer and the silicon-based layer.

Besides, the embodiment does not limit how the metal silicide layer and the silicon-based layer are formed. However, the metal silicide layer usually is formed by the deposition, such as chemical vapor deposition, or the self-alignment silicide fabricating process, but the silicon-based layer usually only is formed by the fabrication, especially the silicon-based layer is a polysilicon layer.

Because the conventional technology usually let one contact only contact with one doped region, or contact with one doped region and gate of one transistor simultaneously, and usually let the electrically couple between different doped regions are provided by some contacts, where these contacts one by one correspond to these doped regions, and some interconnects, which are located on a dielectric layer and contacted with these contacts, at the same time. Indisputably, while these contacts being formed by the high cost material, such as tungsten, the defects of the common source line which is formed by high cost material are unavoidable.

Therefore, this embodiment could form a low cost conductive structure for connecting some doped regions by using both the metal silicide and the silicon-based material. Of course, while these doped regions being not neighboring but are separated, the convenience of this embodiment is less than the usage of the interconnection. However, while these doped regions being neighboring, especially being adjacent, the advantage of this embodiment is significant: because it is not necessary to form the interconnects, the whole structure and the whole fabrication of the integrated circuits could be further simplified.

From the foregoing it will be appreciated that, although specific embodiments of the invention have been described herein for the purpose of illustration, various modifications may be made without deviating from the spirit and scope of the invention. Accordingly, the invention is not limited except as by the appended claims.

What is claimed is:

1. A semiconductor structure with the common source line, comprising:
    a first word line;
    a second word line;
    a plurality of bit lines;
    a silicon-based layer, said silicon-based layer being located on a substrate and between said first word line and said second word line, said silicon-based layer being electrically coupled with said bit lines but being electrically separated from said word lines; and
    a metal silicide layer, said metal silicide layer being located over said silicon-based layer and electrically coupled with said silicon-based layer.

2. The semiconductor structure of claim 1, each said word line being a gate.

3. The semiconductor structure of claim 2, each said gate having a spacer on its sidewall.

4. The semiconductor structure of claim 1, wherein said silicon-based layer being a polysilicon-based layer.

5. The semiconductor structure of claim 1, said silicon-based layer being a doped polysilicon-based layer.

6. The semiconductor structure of claim 1, said silicon-based layer being an N-type doped polysilicon-based layer.

7. The semiconductor structure of claim 1, said metal silicide layer being a $TiSi_x$ layer where x is a positive integer.

8. The semiconductor structure of claim 1, said metal silicide layer being a $CoSi_x$ layer where x is a positive integer.

9. The semiconductor structure of claim 1, the total thickness of both said silicon-based layer and said metal silicide layer being larger than the height of each of said first and second word line on said substrate.

\* \* \* \* \*